(12) United States Patent
Hill et al.

(10) Patent No.: US 7,410,879 B1
(45) Date of Patent: Aug. 12, 2008

(54) SYSTEM AND METHOD FOR PROVIDING A DUAL VIA ARCHITECTURE FOR THIN FILM RESISTORS

(75) Inventors: Rodney Hill, Mansfield, TX (US); Victor Torres, Irving, TX (US); Michael Burger, Arlington, TX (US); Terry L. Lines, Mansfield, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 104 days.

(21) Appl. No.: 11/196,787

(22) Filed: Aug. 3, 2005

Related U.S. Application Data

(63) Continuation-in-part of application No. 11/179,022, filed on Jul. 11, 2005, now Pat. No. 7,332,403.

(51) Int. Cl.
    *H01L 21/20* (2006.01)
(52) U.S. Cl. ...................................... 438/384
(58) Field of Classification Search ........................ None
    See application file for complete search history.

(56) References Cited

U.S. PATENT DOCUMENTS

| 6,097,095 | A  | * | 8/2000  | Chung ........................ 257/774 |
| 6,117,789 | A  | * | 9/2000  | Lee ............................ 438/706 |
| 6,326,256 | B1 | * | 12/2001 | Bailey et al. ................ 438/238 |
| 6,645,821 | B2 | * | 11/2003 | Bailey et al. ................ 438/382 |

* cited by examiner

*Primary Examiner*—David E Graybill

(57) ABSTRACT

A buried thin film resistor having end caps defined by a dielectric mask is disclosed. A thin film resistor is formed on an integrated circuit substrate. A resistor protect layer is formed over the thin film resistor. First and second portions of a first dielectric material are formed over the resistor protect layer over the first and second ends of the thin film resistor. The resistor protect layer is then wet etched using the first and second portions of the first dielectric material as a hard mask. Then a second dielectric layer is deposited. A first via mask and etch process is used to etch vias down to the underlying portions of the resistor protect layer over the ends of the thin film resistor. A second via mask and etch process is used to etch substrate vias to an underlying conductor layer.

20 Claims, 8 Drawing Sheets

SYSTEM AND METHOD FOR PROVIDING A DUAL VIA ARCHITECTURE FOR THIN FILM RESISTORS

RELATED APPLICATIONS

The present application is a continuation-in-part of and claims priority to non-provisional U.S. patent application Ser. No. 11/179,022 filed on Jul. 11, 2005 now U.S. Pat. No. 7,332,403.

TECHNICAL FIELD OF THE INVENTION

The present invention is generally directed to semiconductor technology and, in particular, to thin film resistors and methods for manufacturing thin film resistors.

BACKGROUND OF THE INVENTION

In recent years, there have been great advancements in the speed, power, and complexity of integrated circuits. Some types of integrated circuits comprise thin film resistors. When integrated circuit devices that contain thin film resistors are manufactured, different methods may be employed for manufacturing the thin film resistors.

In some prior art methods for manufacturing a thin film resistor the thin film resistor is located at the same level as a conductor interconnect layer. A major disadvantage of this design is that a resistor protect layer (e.g., titanium tungsten (TiW)) that covers the thin film resistor has a topography from which the conductor interconnect layer must be etched away. The resistor protect layer etches in the same dry etch chemistry as the interconnect conductor. This presents a dilemma in that in order to reduce the step height, a thinner resistor protect metal layer is needed. But a layer that is thin enough that will not leave conductive stringers is too thin to survive the conductor dry etch process.

In U.S. Pat. No. 6,645,821 a method is disclosed for manufacturing a buried thin film resistor having end caps defined by a resist mask. A major disadvantage of this design is that a resist mask is incompatible with many of the etchants that are used to remove the resistor protect layer. For example, the thin film resistor in U.S. Pat. No. 6,645,821 states that a resistor protect layer of titanium tungsten can be etched with hydrogen peroxide in a resist pattern. This is a problem because the resist material etches in hydrogen peroxide. This makes the resist material unsuitable as a masking material.

Therefore, there is a need in the art for an efficient system and method for efficiently providing a resistor protect layer that is able to protect a thin film resistor during the steps of a manufacturing process.

SUMMARY OF THE INVENTION

To address the above-discussed deficiencies of the prior art, it is a primary object of the present invention to provide a system and method for efficiently manufacturing a thin film resistor apparatus in an integrated circuit.

The thin film resistor apparatus of the present invention comprises a buried thin film resistor having end caps defined by a dielectric mask. The thin film resistor apparatus of the present invention is manufactured by first forming a thin film resistor on an integrated circuit substrate. A resistor protect layer is then formed over the thin film resistor. In an advantageous embodiment the thin film resistor material comprises silicon carbide chromium (SiCCr) and the resistor protect layer comprises titanium tungsten (TiW).

A layer of first dielectric material (e.g., silicon oxide) is then formed over the resistor protect layer. The first dielectric material is then masked and dry etched to leave a first portion of first dielectric material over a first end of the thin film resistor and a second portion of first dielectric material over a second end of the thin film resistor. Then the resistor protect layer is wet etched using the first and second portions of the first dielectric material as a hard mask.

Then a second dielectric layer is deposited over the thin film resistor and over the first and second portions of the first dielectric material. A first via resist mask is then formed over the second dielectric layer.

A first via is etched though the second dielectric layer and through the first portion of the first dielectric material down to the portion of the resistor protect layer that is located over the first end of the thin film resistor.

A second via is etched through the second dielectric layer and through the second portion of the first dielectric material down to the portion of the resistor protect layer that is located over the second end of the thin film resistor.

Then the first via resist mask is removed. A second via resist mask is then formed over the second dielectric layer and the first and second vias. Then at least one substrate via is etched down through a substrate oxide layer to an underlying conductor layer. The second via resist mask is then removed from the second dielectric layer and from the first and second vias.

Then the first and second vias and the at least one substrate via are filled with a conductor layer to provide electrical connections to the structures under the vias.

By separately performing (1) the via etch process for the vias that connect to the ends of the thin film resistor, and (2) the via etch process for the at least one substrate via, the thickness of the resistor protect layer that is placed over the thin film resistor may be minimized. This enables the wet etch time for resistor protect layer to be decreased. This means that there will be less etch undercut of the resistor protect layer, less variability in the length of the thin film resistor, and less variability in resistor matching.

It is an object of the present invention to provide a method for efficiently manufacturing a thin film resistor apparatus in an integrated circuit.

It is also an object of the present invention to provide a method for efficiently providing a resistor protect layer to protect a thin film resistor during the steps of a manufacturing process.

It is another object of the present invention to provide a method for forming first and second portions of a first dielectric layer over respective first and second portions of a resistor protect layer that are located over respective first and second ends of a thin film resistor.

It is another object of the present invention to provide a method for etching portions of a resistor protect layer using first and second portions of a first dielectric layer as a hard mask.

It is another object of the present invention to provide a method for minimizing the thickness of a resistor protect layer over a thin film resistor.

The foregoing has outlined rather broadly the features and technical advantages of the present invention so that those persons who are skilled in the art may better understand the detailed description of the invention that follows. Additional features and advantages of the invention will be described hereinafter that form the subject of the claims of the invention. Persons who are skilled in the art should appreciate that they may readily use the conception and the specific embodiment disclosed as a basis for modifying or designing other structures for carrying out the same purposes of the present invention. Persons who are skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

The term "conductor" means any electrically conducting material. The term "conductor" includes but is not limited to metals and metal stacks composed of aluminum, titanium, titanium nitride, tantalum nitride, copper, or tungsten as well as non-metals like polysilicon or doped polysilicon.

Definitions for certain words and phrases are provided throughout this patent document, those persons of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 23, discussed below, and the various embodiments used to describe the principles of the present invention in this patent document are by way of illustration only and should not be construed in any way to limit the scope of the invention. Persons who are skilled in the art will understand that the principles of the present invention may be implemented in any type of suitably arranged semiconductor device.

Figure 1:
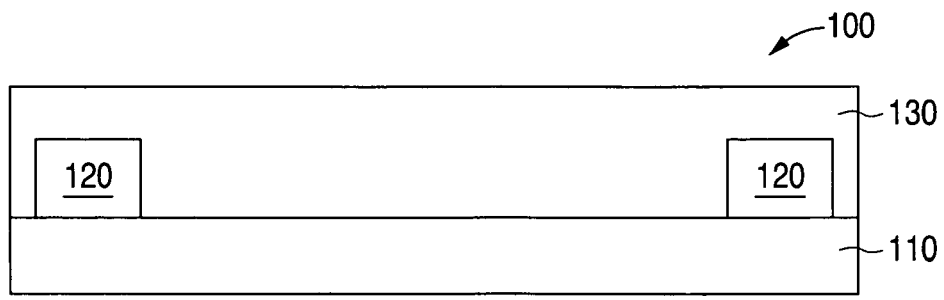
FIG. 1 illustrates a substrate comprising a first substrate oxide layer, a first conductor layer, and a second substrate oxide layer that covers the first substrate oxide layer and the first conductor layer for use in manufacturing a semiconductor device according to the principles of the present invention.

FIG. 1 illustrates a substrate 100 for use in manufacturing a semiconductor device according to the principles of the present invention. The foundation of substrate 100 comprises a first substrate oxide layer 110 on which a patterned first conductor layer 120 is formed. Substrate 100 further comprises a second substrate oxide layer 130 that covers the first substrate oxide layer 110 and the first conductor layer 120. In an advantageous embodiment of the invention the upper surface of the second substrate oxide layer 130 is substantially flat. The upper surface of the second substrate oxide layer 130 may be planarized by a chemical mechanical polishing (CMP) procedure.

In addition, a thin oxide layer (not shown in FIG. 1) may be deposited on the polished oxide layer 130. In one advantageous embodiment the thickness of the thin oxide layer is approximately five hundred Ångstroms (500 Å). The thin oxide layer covers "micro-scratches" or other irregularities in the polished surface of the oxide layer 130 that could impact the precision of the thin film resistors to be formed. In the illustrative example shown in FIG. 1 the insulating layer of substrate material is a layer of oxide. It is understood that the use of oxide is merely illustrative and that the insulating layer of substrate material may be made of any suitable dielectric material.

Figure 2:
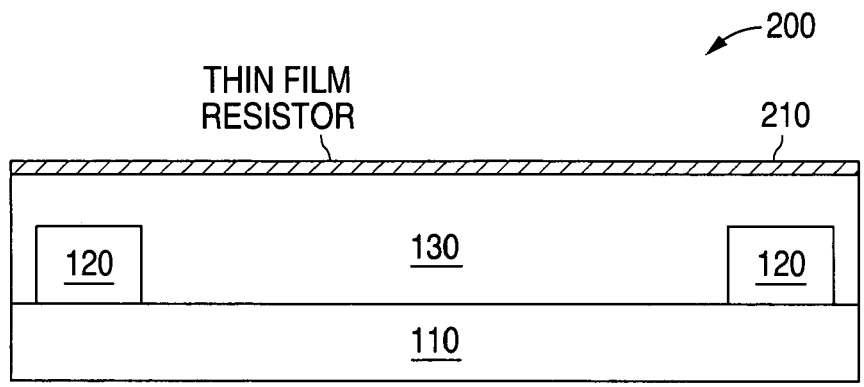
FIG. 2 illustrates the substrate shown in FIG. 1 in which a layer of thin film resistor material has been deposited on the surface of the second substrate oxide layer.

In the next step of the manufacturing method of the invention a layer of thin film resistor material is deposited. In an advantageous embodiment of the invention the thin film resistor material comprises silicon carbide chromium (SiCCr). The thin film resistor material may comprise silicon chromium (SiCr), nickel chromium (NiCr), titanium nitride (TiN) or tantalum nitride (TaN). FIG. 2 illustrates a device 200 in which a layer of thin film resistor material 210 has been deposited on the surface of the second substrate oxide layer 130 of the substrate 100. In an advantageous embodiment of the invention the thickness of the thin film resistor material 210 is in a range of approximately seventy five Ångstroms (75 Å) to one hundred fifty Ångstroms (150 Å).

Figure 3:
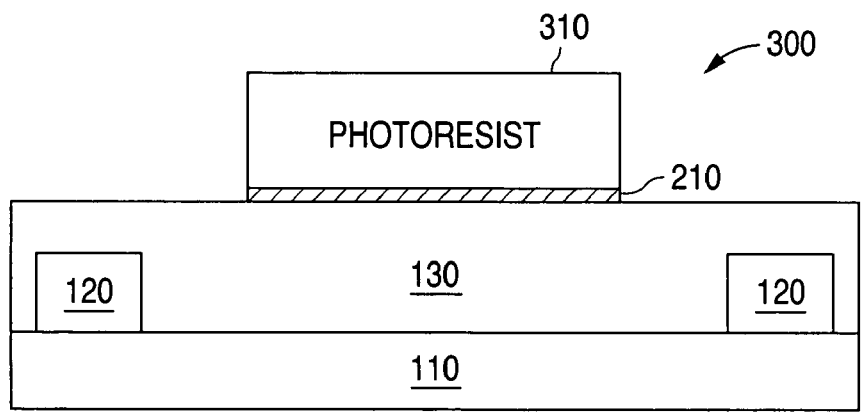
FIG. 3 illustrates the device shown in FIG. 2 in which a photoresist mask has been applied to cover the thin film resistor material and an etch process has been applied to etch away the exposed portions of the thin film resistor material.

In the next step of the manufacturing method of the invention the layer of thin film resistor material 210 is masked and etched. A photoresist mask 310 is applied to cover the portions of the thin film resistor material 210 that will form the thin film resistor. A conventional etch process is then applied to etch away the exposed portions of the thin film resistor material 210. FIG. 3 illustrates a device 300 that shows the location of the photoresist mask 310 over the thin film resistor material 210. FIG. 3 also illustrates the result of applying the etch process to etch away the exposed portions of the thin film resistor material 210.

Figure 4:
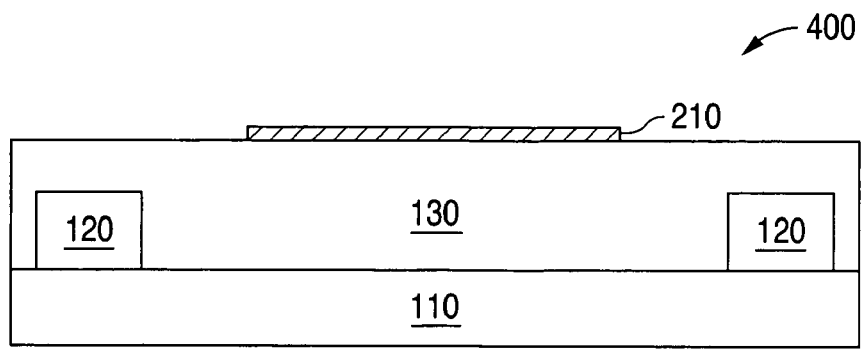
FIG. 4 illustrates the device shown in FIG. 3 in which the photoresist mask has been stripped away.

In the next step of the manufacturing method of the invention the photoresist mask 310 is stripped away. FIG. 4 illustrates a device 400 that results after the photoresist mask 310 has been stripped away.

Figure 5:
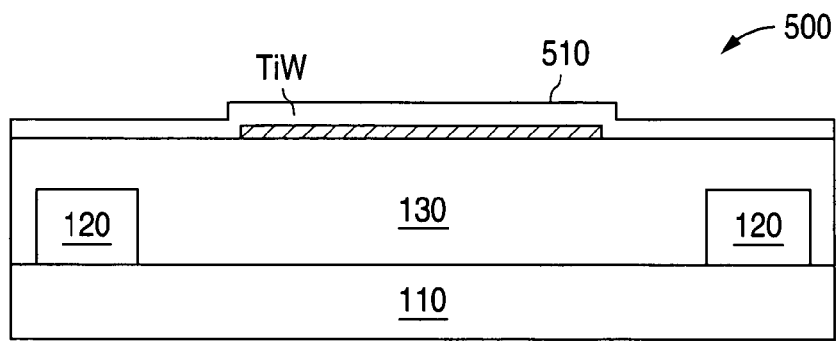
FIG. 5 illustrates the device shown in FIG. 4 in which a layer of titanium tungsten has been deposited to cover the thin film resistor material and the exposed portions of the second substrate oxide layer.

In the next step of the manufacturing method of the invention a resistor protect layer is applied. In an advantageous embodiment of the invention the resistor protect layer comprises titanium tungsten (TiW). The resistor protect layer may also comprise tungsten (W), aluminum (Al), titanium nitride (TiN) or molybdenum (Mo). FIG. 5 illustrates a device 500 in which a layer of titanium tungsten (TiW) 510 has been deposited to cover the thin film resistor material 210 and the exposed portions of the second substrate oxide layer 130.

In an advantageous embodiment of the invention the thickness of the layer of titanium tungsten (TiW) 510 is approximately eight hundred Ångstroms (800 Å) to one thousand Ångstroms (1000 Å). This thickness is significantly less than the thickness of a titanium tungsten (TiW) layer that would be required (e.g., three thousand five hundred Ångstroms (3500 Å) to four thousand five hundred Ångstroms (4500 Å)) if the vias that are subsequently etched to ends of the thin film resistor material 210 were simultaneously etched with the vias to the first conductor layer 120.

The layer of titanium tungsten (TiW) 510 must wet etch easily in a solution that does not attack the thin film resistor material 210. A dry etch process that ends on the thin film resistor material 210 will create undesirable variations in the electrical resistance, resistor matching or physical dimensions of the thin film resistor material 210. Likewise, a dry etch process that simultaneously defines the resistor and resistor protect layers (i.e., elimination of one mask and one etch step) will create undesirable variations in the electrical resistance, resistor matching or physical dimensions of the thin film resistor material 210. The layer of titanium tungsten (TiW) 510 must protect the thin film resistor material 210 during the patterning of the next layer and during a subsequent via etch process.

Figure 6:
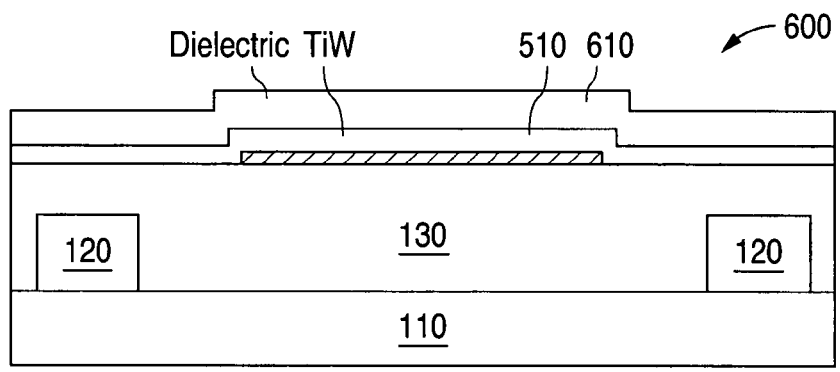
FIG. 6 illustrates the device shown in FIG. 5 in which a first dielectric layer has been deposited to cover the layer of titanium tungsten.

In the next step of the manufacturing method of the invention a relatively thin first dielectric layer is applied. FIG. 6 illustrates a device 600 in which a thin first dielectric layer 610 has been deposited to cover the thin layer of titanium tungsten (TiW) 510. In an advantageous embodiment of the invention the material of the first dielectric layer 610 comprises silicon oxide (SiO). It is understood that any suitable dielectric material may also be used. In an advantageous embodiment of the invention the thickness of the first dielectric layer 610 is approximately one thousand three hundred Ångstroms (1,300 Å).

The relatively thin first dielectric layer 610 will be used as a hard mask during a subsequent etching of resistor protect layer 510. The chemical solutions that are used to wet etch the titanium tungsten (TiW) layer 510 are not compatible with using photoresist only as a mask.

Figure 7:
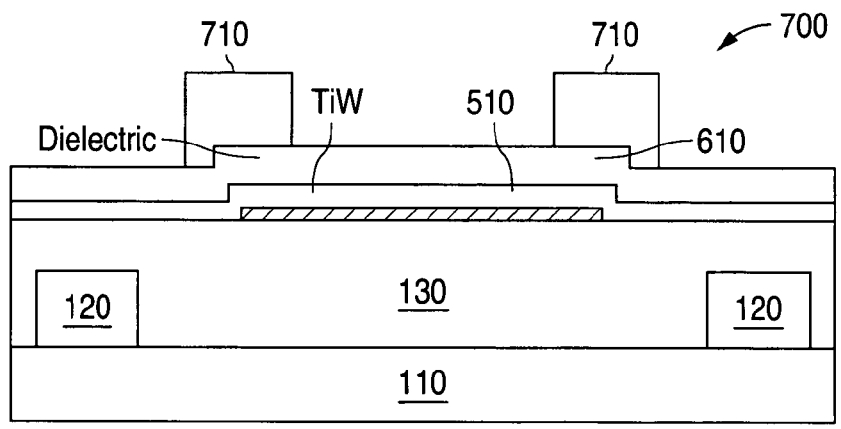
FIG. 7 illustrates the device shown in FIG. 6 in which a patterned resistor protect photoresist mask has been applied to cover portions of the first dielectric layer that are located at the ends of the thin film resistor material.

In the next step of the manufacturing method of the invention a patterned resistor protect photoresist mask 710 is applied to cover portions of the first dielectric layer 610 that are located at the ends of the thin film resistor 210. FIG. 7 illustrates a device 700 showing the location of photoresist mask 710. The pattern of the photoresist mask 710 covers the first dielectric layer 610 and the titanium tungsten (TiW) layer 510 at the ends of the thin film resistor 210. The unetched portion forms the headers (or end caps) in the first dielectric layer 610. Photoresist mask 710 does not cover the full length of the thin film resistor 210.

The thickness of first dielectric layer 610 and the thickness of the titanium tungsten (TiW) layer 510 and the thickness of the thin film resistor material 210 shown in the drawings have not been drawn to scale. The dimensions of the thicknesses have been exaggerated for clarity in the drawings. Therefore the "step height" of the first dielectric layer 610 over the titanium tungsten (TiW) layer 510 (at the ends of the thin film resistor 210) is not large. The "step height" is in a range of approximately seventy five Ångstroms (75 Å) to one hundred fifty Ångstroms (150 Å).

Figure 8:
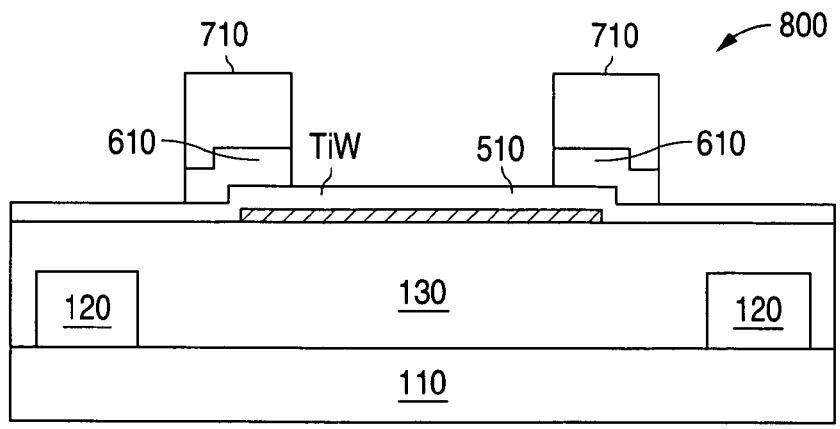
FIG. 8 illustrates the result of performing a dry dielectric etch process to the device shown in FIG. 7 in which the etch process stops on the titanium tungsten layer.

In the next step of the manufacturing method of the invention a dry etch process is used to etch the first dielectric layer 610. FIG. 8 illustrates a device 800 showing the result of performing a dry etch process to the first dielectric layer 610. The etch process stops on the titanium tungsten (TiW) layer 510.

Figure 9:
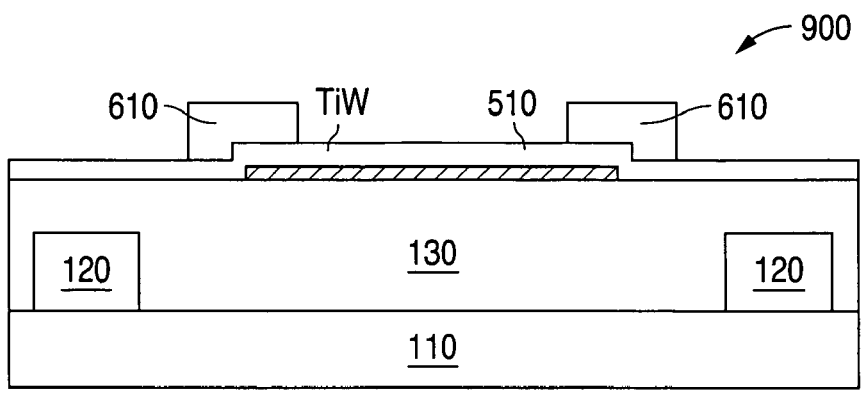
FIG. 9 illustrates the result of stripping away the patterned resistor protect photoresist mask from the device shown in FIG. 8.

In the next step of the manufacturing method of the invention the resistor protect photoresist mask 710 is stripped away. FIG. 9 illustrates a device 900 that results after the resistor protect photoresist mask 710 has been stripped away.

Figure 10:
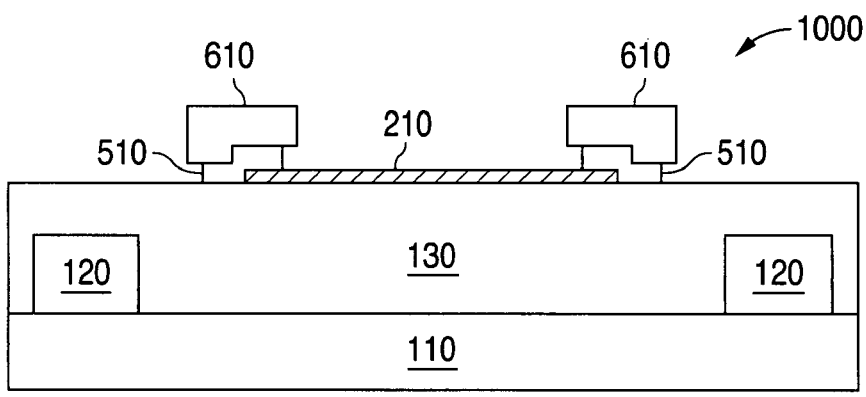
FIG. 10 illustrates the result of performing a wet titanium tungsten etch process to the device shown in FIG. 9 in which the first dielectric layer serves as a hard mask.

In the next step of the manufacturing method of the invention a wet etch process is used to etch the titanium tungsten (TiW) layer 510. Hydrogen peroxide ($H_2O_2$) is commonly used to perform a wet etch on titanium tungsten (TiW). FIG. 10 illustrates a device 1000 showing the result of performing a wet etch process to the device 900 shown in FIG. 9. The first dielectric layer 610 serves as a hard mask for the wet etch process.

FIG. 10 shows that the portions of the titanium tungsten (TiW) layer 510 that previously covered the central portion of the thin film resistor 210 have been etched away. Similarly, FIG. 10 shows that the portions of the titanium tungsten (TiW) layer 510 that previously covered the second substrate oxide layer 130 have also been etched away. The only portions of the titanium tungsten (TiW) layer 510 that remain are those portions that are located under the remaining portions of the first dielectric layer 610 at the ends of the thin film resistor 210.

Figure 11:
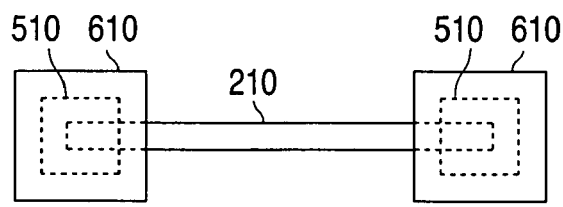
FIG. 11 illustrates a plan view of the thin film resistor portion of the device shown in FIG. 10.

FIG. 11 illustrates a plan view of the thin film resistor 210 of the device 1000 shown in FIG. 10. Each end of thin film resistor 210 is located under (and is in electrical contact with) a remaining "end cap" portion of the titanium tungsten (TiW) layer 510. Each remaining end cap portion of the titanium tungsten (TiW) layer 510 is located under its respective remaining "end cap" portion of the first dielectric layer 610.

Figure 12:
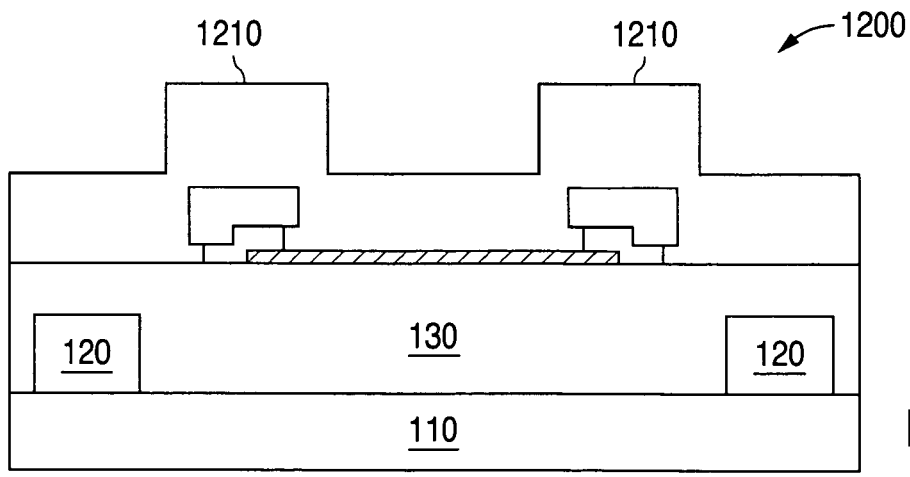
FIG. 12 illustrates the result of depositing a second dielectric layer over the device shown in FIG. 10.

In the next step of the manufacturing method of the invention a second dielectric layer 1210 is deposited over the device 1000 that is shown in FIG. 10. FIG. 12 illustrates a device 1200 that results after second dielectric layer 1210 has been deposited. The second dielectric layer 1210 must be thick enough to protect the thin film resistor 210 during a subsequent metal overetch process.

In an advantageous embodiment of the invention the thickness of the second dielectric layer 1210 is approximately three thousand five hundred Ångstroms (3,500 Å). The step height of the second dielectric layer 1210 over the ends of the thin film resistor 210 will be determined by the total thickness of the thin film resistor 210, the titanium tungsten (TiW) layer 510, and the first dielectric layer 610.

Figure 13:
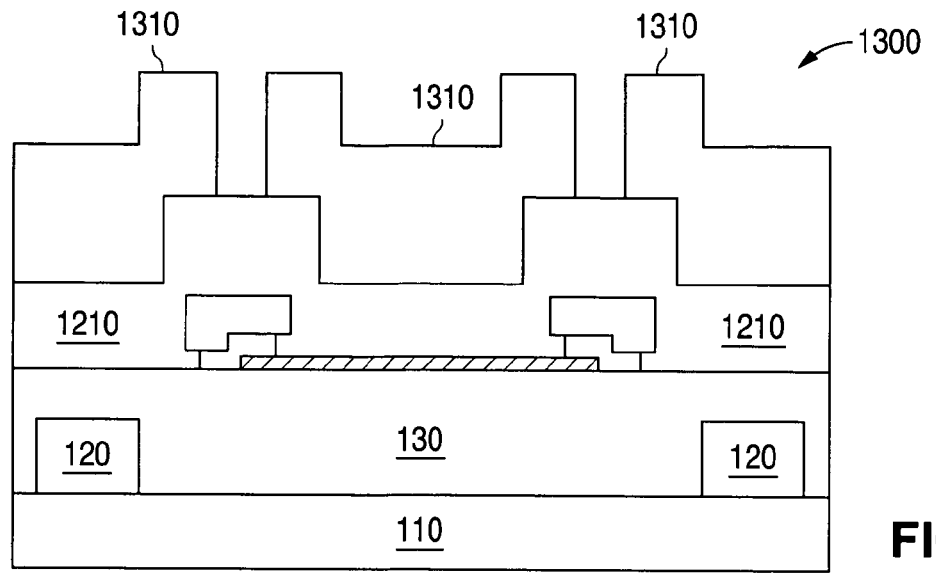
FIG. 13 illustrates the result of applying a first via resist mask over the device shown in FIG. 12.

In the next step of the manufacturing method of the invention a first via resist mask 1310 is formed over the device 1200 that is shown in FIG. 12. FIG. 13 illustrates a device 1300 that results after the first via resist mask 1310 has been formed. The first via resist mask 1310 may be formed by a conventional photolithographic manufacturing process.

In the next step of the manufacturing method of the invention a first via dry etch process is applied to etch vias down to the titanium tungsten (TiW) layer 510 that is located over the ends of the thin film resistor 210. The first via dry etch process etches through both the second dielectric layer 1210 and the first dielectric layer 610 down to the titanium tungsten (TiW) layer 510. In an advantageous embodiment of the method of the invention the depth of the vias down to the titanium tungsten (TiW) layer 510 is approximately four thousand eight hundred Ångstroms (4800 Å).

Note that if a via resist mask and a via dry etch process were used to etch vias down to the titanium tungsten (TiW) layer 510 that is located over the ends of the thin film resistor 210, and at the same time down to the first conductor layer 120, then the thickness of the titanium tungsten (TiW) layer 510 would have to be thick enough so that the titanium tungsten (TiW) would last through the added overetch that is required to reach the first conductor layer 120.

In such a case, the thickness of the titanium tungsten (TiW) layer 510 would have to be approximately three thousand five hundred Ångstroms (3500 Å) to four thousand five hundred Ångstroms (4500 Å).

As will be more fully described, the present invention reduces the thickness of the titanium tungsten (TiW) layer 510 that would otherwise be required by separately performing two via etch processes. In the first via etch process vias are etched down to the ends of the titanium tungsten (TiW) layer 510 that is located over the ends of the thin film resistor 210. In the second via etch process vias are etched down to the first conductor layer 120. By separately performing the two etch processes the thickness of the titanium tungsten (TiW) layer 510 may be reduced to approximately eight hundred Ångstroms (800 Å) to one thousand Ångstroms (1000 Å).

Figure 14:
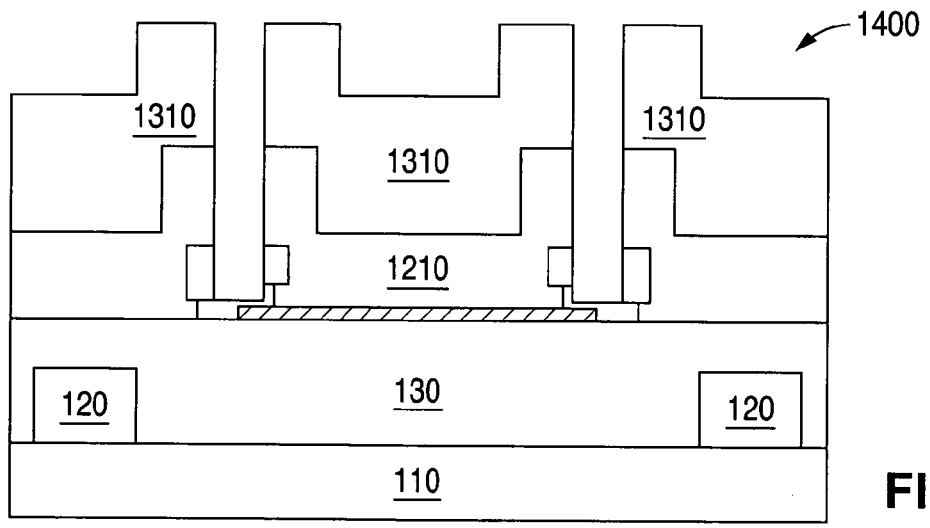
FIG. 14 illustrates the result of applying a dry etch process to the device shown in FIG. 13 to etch vias down to the titanium tungsten layer over the ends of the thin film resistor.

FIG. 14 illustrates a device 1400 that results from applying the first via etch process to the device shown in FIG. 13 to etch vias down to the titanium tungsten (TiW) layer 510 that is located over the ends of the thin film resistor 210. In one advantageous embodiment of the method of the invention the via etch process etches away approximately two hundred Ångstroms (200 Å) to five hundred Ångstroms (500 Å) of the titanium tungsten (TiW) layer 510. This is significantly less than the amount of the titanium tungsten (TiW) layer 510 that would be required to be etched away (e.g., two thousand Ångstroms (2000 Å) to three thousand Ångstroms (3000 Å)) if the thin film resistor vias were simultaneously etched with the vias to the first conductor layer 120.

Figure 15:
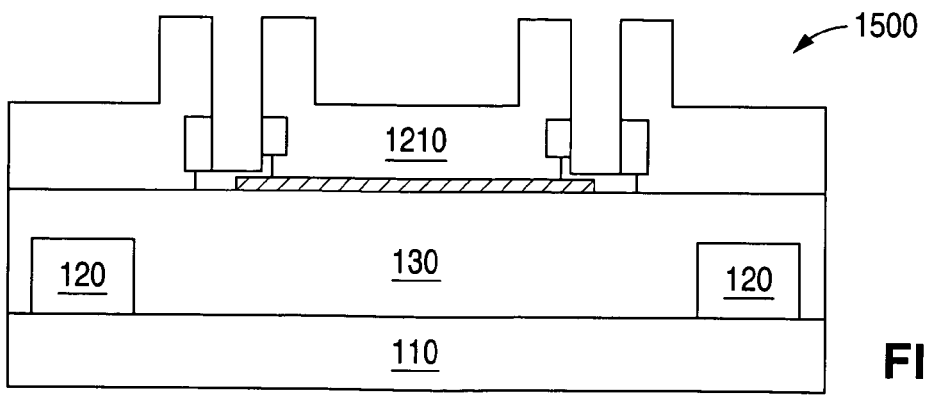
FIG. 15 illustrates the result of stripping away the first via resist mask from the device shown in FIG. 14.

In the next step of the manufacturing method of the invention the first via resist mask 1310 is stripped away. FIG. 15 illustrates a device 1500 that results after the first via resist mask 1310 has been stripped away from the device 1400 shown in FIG. 14.

Figure 16:
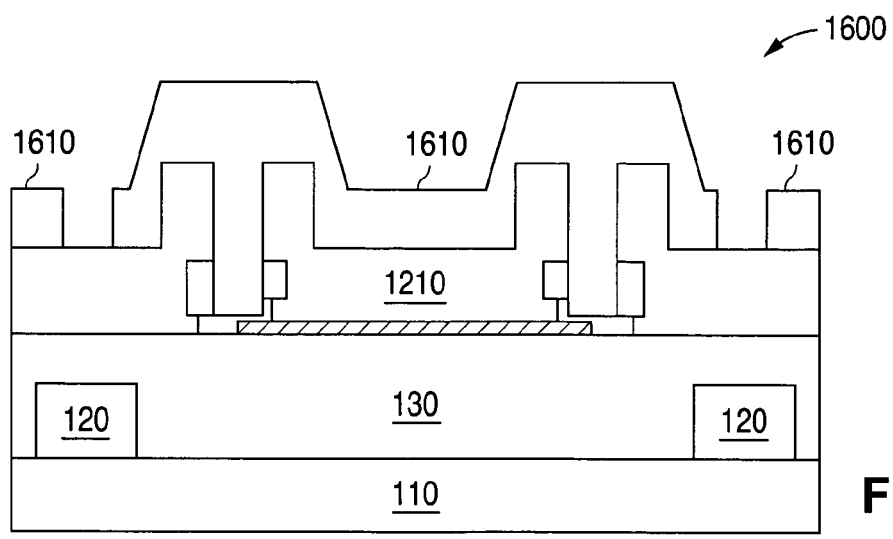
FIG. 16 illustrates the result of depositing a second via resist mask the device shown in FIG. 15.

In the next step of the manufacturing method of the invention a second via resist mask 1610 is deposited over the device 1500 that is shown in FIG. 15. FIG. 16 illustrates a device 1600 that results after the second via resist mask 1610 has been deposited. The material of the second via resist mask 1610 fills the vias down to the titanium tungsten (TiW) layer 510 that is located over the ends of the thin film resistor 210. The second via resist mask 1610 is patterned to form apertures that open onto second dielectric layer 1210 where vias are to be etched down to the first conductor layer 120.

Figure 17:
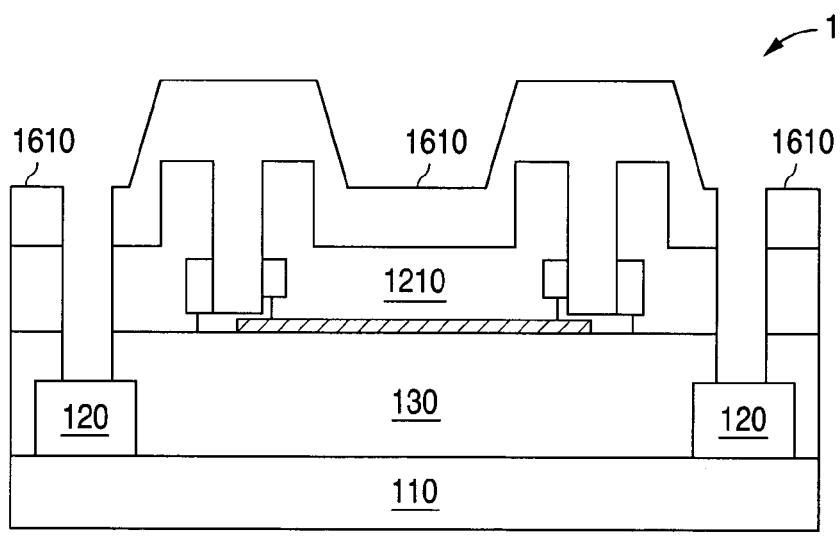
FIG. 17 illustrates the result of applying a dry etch process to the device shown in FIG. 16 to etch vias down to the first conductor layer.

In the next step of the manufacturing method of the invention a second via dry etch process is applied to etch vias down to the first conductor layer 120. The second via dry etch process etches through both the second dielectric layer 1210 and the second substrate oxide layer 130 down to the first conductor layer 120. FIG. 17 illustrates a device 1700 that results from applying the second via etch process to the device shown in FIG. 16 to etch vias down to the to the first conductor layer 210.

Figure 18:
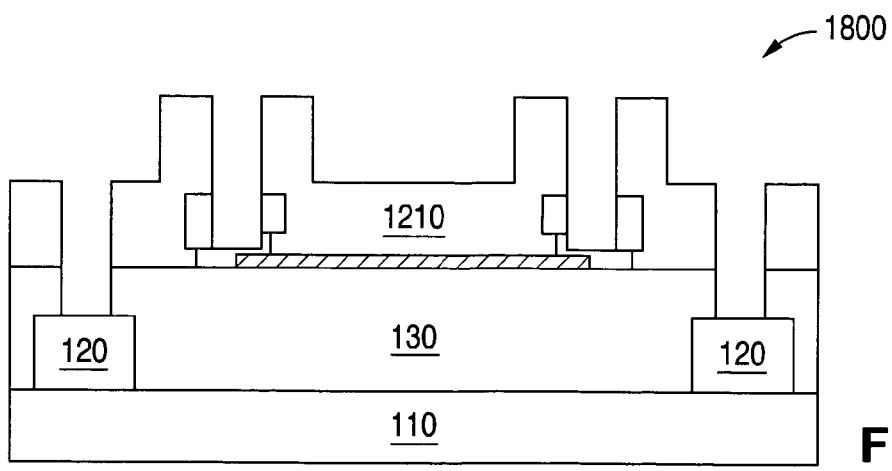
FIG. 18 illustrates the result of stripping away the second via resist mask from the device shown in FIG. 17.

In the next step of the manufacturing method of the invention the second via resist mask 1610 is stripped away. FIG. 18 illustrates a device 1800 that results after the second via resist mask 1610 has been stripped away.

Figure 19:
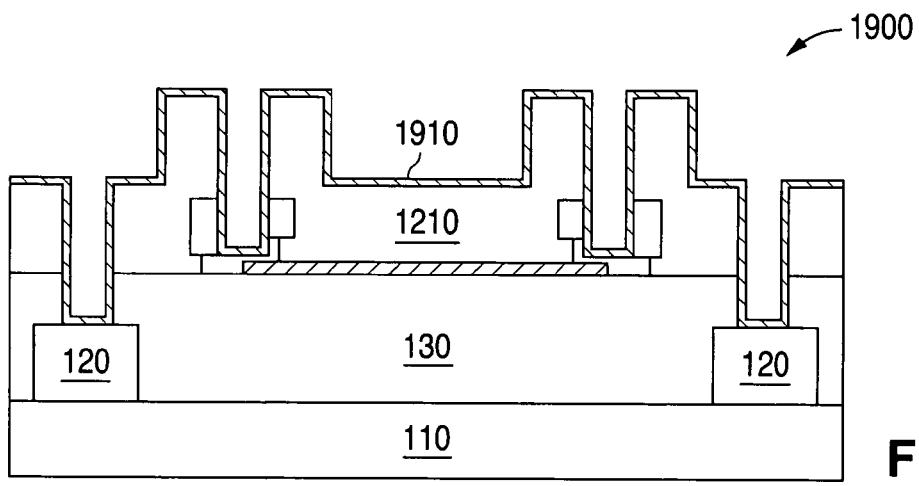
FIG. 19 illustrates the result of depositing a layer of plug liner material on the device shown in FIG. 18.

In the next step of the manufacturing method of the invention a plug liner material 1910 is deposited over the device that is shown in FIG. 18. FIG. 19 illustrates a device 1900 that results after the plug liner material 1910 has been deposited.

In the next step of the manufacturing method of the invention a layer of second conductor material 2010 is deposited to fill the vias. The portions of the second conductor material 2010 that are located outside of the vias are then etched away. The second conductor material 2010 fills both the vias that extend down to the first conductor layer 120 and the vias that extend down to the down to the ends of the titanium tungsten (TiW) layer 510 that is located over the ends of the thin film resistor 210. In one advantageous embodiment the second conductor material 2010 comprises tungsten (W) metal.

Figure 20:
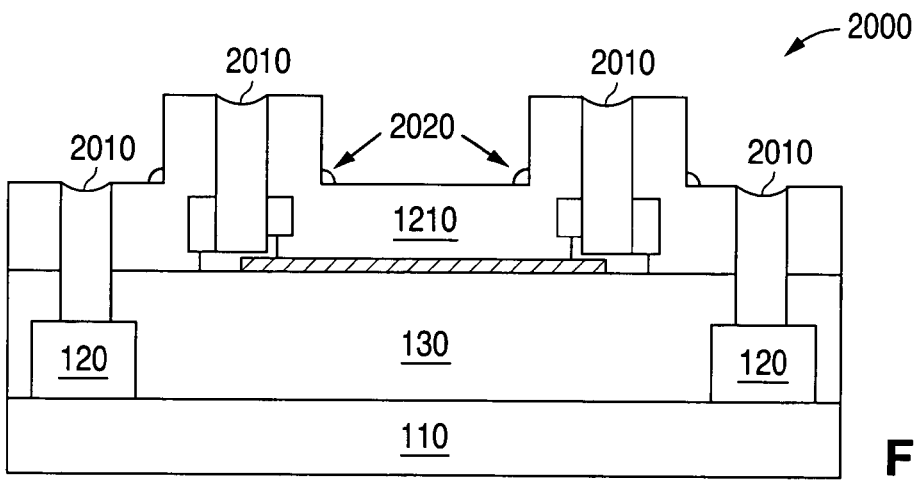
FIG. 20 illustrates the result of depositing and etching a layer of second conductor material to fill the vias in the device shown in FIG. 19.

FIG. 20 illustrates a device 2000 that results from depositing and etching the second conductor layer 2010 on the device 1900 that is shown in FIG. 19. The etch process that is applied to the second conductor layer 2010 may leave stringers 2020 of the second conductor layer 2010 on the surface of the second dielectric layer 1210. The stringers 2020 may surround the columns of second dielectric layer 1210 material that support the vias of second conductor layer 2010. If stringers 2020 are formed they do not short along the thin film resistor 210. The thin film resistor 210 is protected by the insulation that is provided by the second dielectric layer 1210.

In the next step of the manufacturing method of the invention a layer of third conductor material 2110 is deposited over the device 2000 that is shown in FIG. 20. A metal etch resist mask (not shown) is then formed over the layer of third conductor material 2110. The metal etch resist mask may be formed by a conventional photolithographic manufacturing process.

Figure 21:
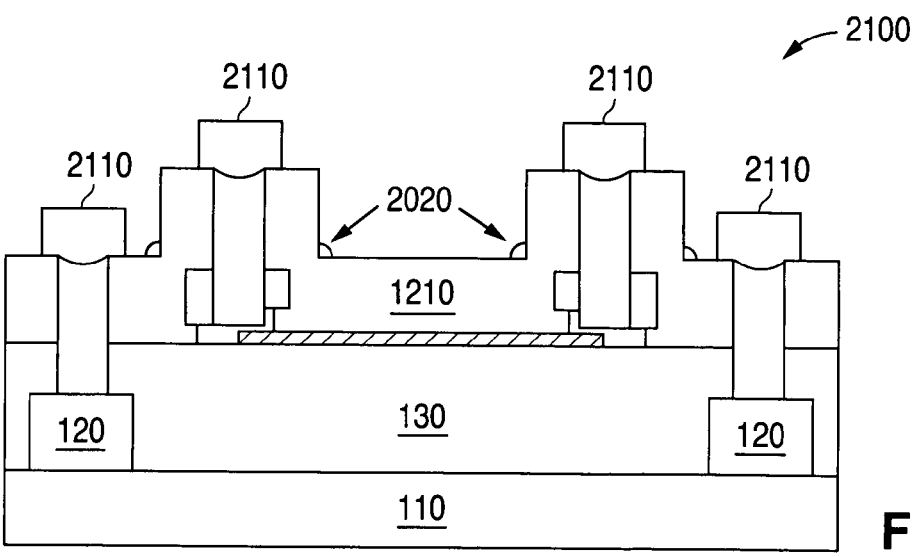
FIG. 21 illustrates the result of a metal deposition and an application of a mask and etch process to deposit a third conductor material over the vias of the device shown in FIG. 20.

In the next step of the manufacturing method of the invention a metal etch process is applied to etch away portions of the layer of third conductor material 2110 that are not covered by the metal etch mask. FIG. 21 illustrates a device 2100 that results from applying the metal etch process to etch away portions of the layer of third conductor material 2110. The portions of the layer of third conductor material 2110 that remain after the etch process is completed are in contact with the portions of the second conductor layer 2010 that are located within the vias.

Figure 22:
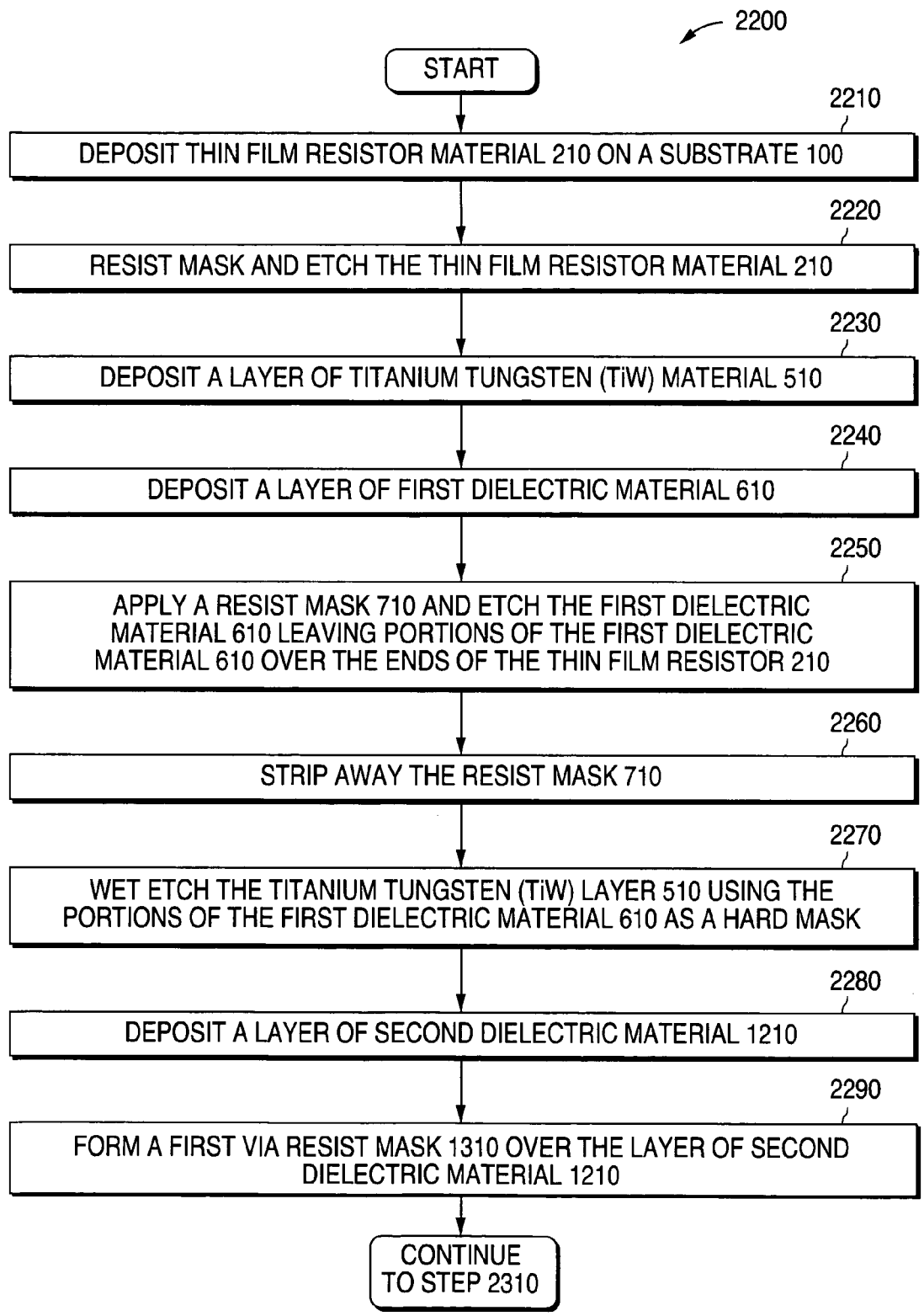
FIG. 22 illustrates an advantageous embodiment of a first portion of a method of the present invention.

FIG. 22 illustrates an advantageous embodiment of a first portion of a method of the present invention. The steps of the invention shown in FIG. 22 are collectively designated with reference numeral 2200. The method of the present invention begins with a deposition of thin film resistor material 120 on a substrate 100 (step 2210). Then a resist mask is deposited and the thin film material 210 is etched (step 2220). Then a layer of titanium tungsten (TiW) material 510 is deposited (step 2230). Then a layer of first dielectric material 610 is deposited (step 2240).

In the next step of the method a resist mask 710 is applied and the first dielectric material 610 is etched leaving portions of the first dielectric material 610 over the ends of the thin film resistor 210 (step 2250). Then the resist mask 710 is stripped away (step 2260). Then the titanium tungsten (TiW) layer 510 is wet etched using the portions of the first dielectric material 610 as a hard mask (step 2270).

Then a layer of second dielectric material 1210 is deposited (step 2280). Then a first via resist mask 1310 is formed over the layer of second dielectric material 1210 (step 2290). The next step of the method is described in step 2310 of FIG. 23.

Figure 23:
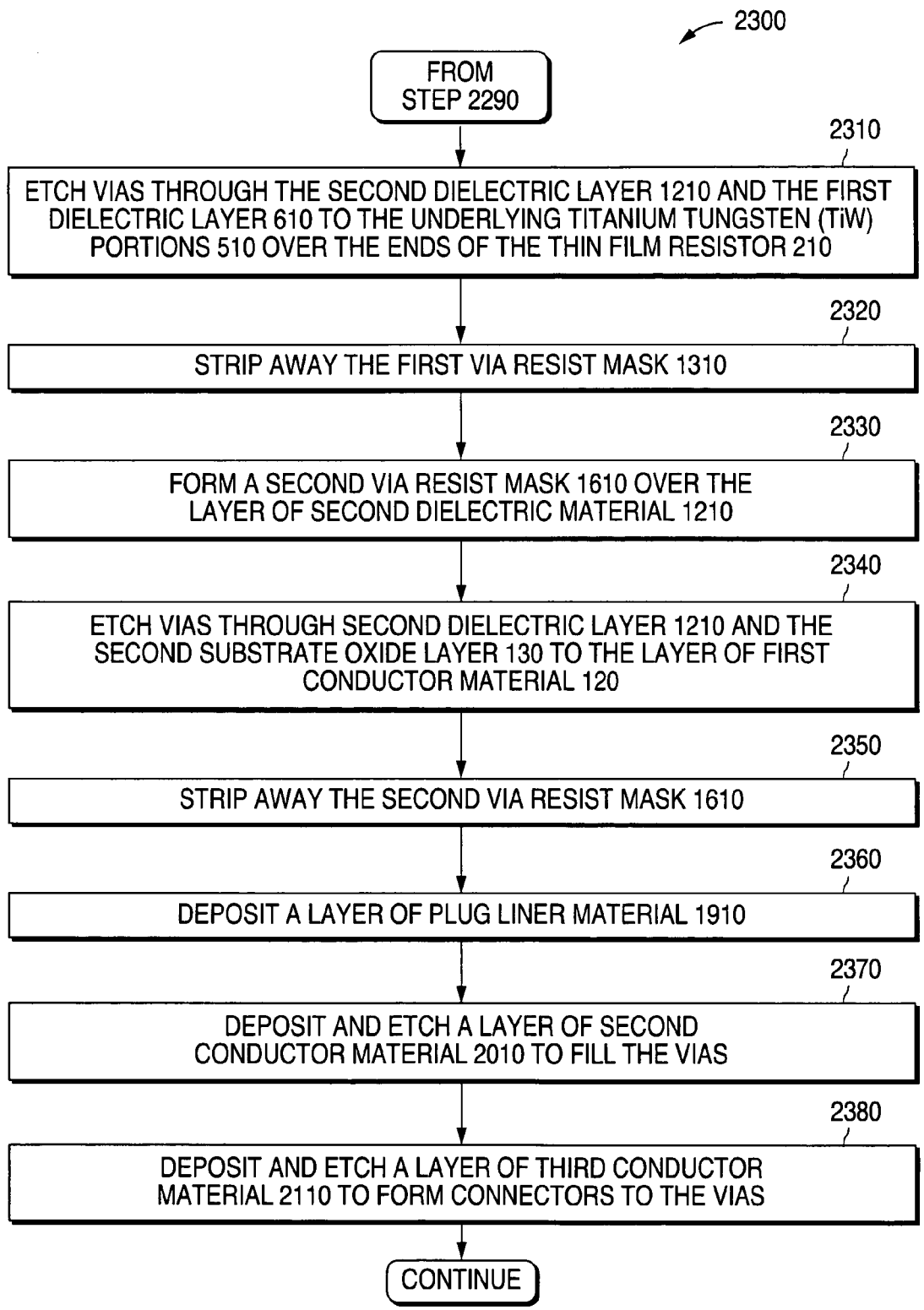
FIG. 23 illustrates an advantageous embodiment of a second portion of a method of the present invention.

FIG. 23 illustrates an advantageous embodiment of a second portion of a method of the present invention. The steps of the invention shown in FIG. 23 are collectively designated with reference numeral 2300. The method step described in step 2310 is performed after the method step 2290 in FIG. 22.

A first via dry etch process is applied to etch vias through the second dielectric layer 1210 and through the first dielectric layer 610 to the underlying titanium tungsten (TiW) portions 510 that are located over the ends of the thin film resistor 210 (step 2310). Then the first via resist mask 1310 is stripped away (step 2320).

Then a second via resist mask 1610 is formed over the layer of second dielectric material 1210 (step 2330). A second via dry etch process is then applied to etch vias through the second dielectric layer 1210 and through the second substrate oxide layer 130 to the underlying layer of first conductor material 120 (step 2340). Then the second via resist mask 1610 is stripped away (step 2350). Then a layer of plug liner material 1910 is deposited over the second dielectric layer 1210 (step 2360).

Then a layer of second conductor material 2010 is deposited and etched to fill the vias (step 2370). Then a layer of third conductor material 2110 is deposited and etched to form connectors to the vias (step 2380).

The present invention has been described for an embodiment in which there are two thin film resistor vias, each of which is etched to one of the two ends of a thin film resistor. It is understood that for different design requirements the system and method of the invention may also be applied to etch a via to only one end of a thin film resistor. In such a case the other end of the thin film resistor would be electrically connected to other circuit elements using a different method.

The present invention has several advantages over the techniques that exist in the prior art. For example, the present invention provides better length control (i.e., better resistance control) using a hard mask in place of a resist mask to minimize the variation in header size, consequently reducing the variation in the length of the resistor and improving the resistor matching. Wet etching titanium tungsten (TiW) in hydrogen peroxide is incompatible with a resist mask and would lead to very poor control of the resistor properties.

The present invention does not produce any topographic steps that could cause thin film resistor shorts. A further advantage of the present invention is using separate masking and etch steps to define the resistor and the resistor protect. This allows for overlap of the resistor by the resistor protect layer in all directions. This prevents the resistor edges from being exposed to processing and leads to better control of the resistor material properties (e.g., matching and resistances).

In dry etching there is a poor selectivity between the interconnect conductor layer and the thin film resistor 210. The layer of interconnect conductor in an interconnect stack tends to be relatively thick. Therefore, if a prior art wet etch method is used the wet etch has to be used for a relatively long period of time. The longer a wet etch process continues, the larger the variations are in the dimensions of the thin film resistor as defined by the final end cap spacing. The present invention takes advantage of the wet etch selectivity but improves the thin film resistor dimensional control by using a thin titanium tungsten (TiW) layer (short wet etch required) to make contact to the thin film resistor material.

In addition, modern interconnect layers are not all made of a single film of material. There may be a number of different materials in an interconnect layer. For example, there may be titanium (Ti), titanium nitride (TiN), aluminum (Al), titanium tungsten (TiW), etc. Finding a wet etch that would deal with all the different layers is nearly impossible. One would have to do multiple wet etches in order to deal with the different materials in the stack, and still find an etch process that would not attack the thin film resistor during the wet etching of the interconnect stack.

As previously described, the method of the present invention reduces the thickness of the titanium tungsten (TiW) layer 510 that would otherwise be required if only one via etch process were performed. The method of using one via etch process that is disclosed in U.S. patent application Ser. No. 11/179,022 requires a relatively thick titanium tungsten (TiW) resistor protect layer so that the titanium tungsten (TiW) resistor protect layer will be able to survive the via etch process. A thick titanium tungsten (TiW) resistor protect layer reduces the precision of the thin film resistor elements.

In the present invention the thickness of the titanium tungsten (TiW) layer 510 can be reduced to approximately eight hundred Ångstroms (800 Å) to one thousand Ångstroms (1000 Å). The reduced thickness of the titanium tungsten (TiW) layer 510 means that the wet etch time will be shorter than it otherwise would be. A shorter wet etch time means that there will be less undercut of the titanium tungsten (TiW) layer 510. The reduced thickness of the titanium tungsten (TiW) layer 510 also reduces the variability in the thin film resistor length and reduces the variability in the resistor matching.

An advantageous embodiment of the present invention has been described in which the dual via thin film resistor architecture is implemented at an interconnect level that is located above the first metal layer. It is understood that the present invention is not limited to this example, and that the present invention may also be implemented at the first metal layer. In such a case, the first via would form a connection to the titanium tungsten (TiW) resistor protect layer as previously described. The second via mask and etch process would form a contact to mono-crystalline silicon.

An advantageous embodiment of the present invention has been described in which a tungsten plug process is used to fill the via portions of the interconnect conductor layer. It is understood that the present invention is not limited to this example, and that any suitable conductor material could be used such as aluminum (Al).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing an integrated circuit, said method comprising the steps of:
   forming a thin film resistor on an integrated circuit substrate;
   forming a resistor protect layer over said thin film resistor;
   forming a first portion of a first dielectric material over said resistor protect layer over a first end of said thin film resistor and a second portion of said first dielectric material over said resistor protect layer over a second end of said thin film resistor;
   etching said resistor protect layer using said first and second portions of said first dielectric layer as a hard mask to expose a top surface of the thin film resistor; and
   forming a layer of second dielectric material over said exposed top surface of said thin film resistor, said etched resistor protect layer, and said first and second portions of said first dielectric material.

2. The method as set forth in claim 1 wherein a value of thickness of said resistor protect layer is in a range of approximately eight hundred Ångstroms to one thousand Ångstroms.

3. The method as set forth in claim 2 wherein said thin film resistor comprises one of: silicon chromium (SiCr), silicon carbide chromium (SiCCr), nickel chromium (NiCr), titanium nitride (TiN), and tantalum nitride (TaN).

4. The method as set forth in claim 2 wherein said resistor protect layer comprises one of: tungsten, titanium tungsten, titanium nitride, aluminum, and molybdenum.

5. The method as set forth in claim 2 wherein said step of etching said resistor protect layer comprises:
   etching said resistor protect layer with a wet etch process.

6. The method as set forth in claim 2 further comprising the step of:
   forming a first via resist mask over said layer of second dielectric material.

7. The method as set forth in claim 6 further comprising the steps of:
   etching a first via through said second dielectric material and trough said first portion of said first dielectric material down to said resistor protect layer that is located over said first end of said thin film resistor; and
   etching a second via through said second dielectric material and through said second portion of said first dielectric material down to said resistor protect layer that is located over said second end of said thin film resistor.

8. The method as set forth in claim 7 wherein said process of etching said first via removes a value of thickness of said resistor protect layer that is over said first end of said thin film resistor that is in a range of approximately two hundred Ångstroms to five hundred Ångstroms; and
   wherein said process of etching said second via removes a value of thickness of said resistor protect layer that is over said second end of said thin film resistor that is in a range of approximately two hundred Ångstroms to five hundred Ångstroms.

9. The method as set forth in claim 7 wherein said process of etching said first via etches a depth of said first via to approximately four thousand eight hundred Ångstroms; and
   wherein said process of etching said second via etches a depth of said second via to approximately four thousand eight hundred Ångstroms.

10. The method as set forth in claim 7 further comprising the steps of:
    removing said first via resist mask from said layer of second dielectric material; and
    forming a second via resist mask over said layer of second dielectric material and over said first and second vias.

11. The method as set forth in claim 10 further comprising the step of:
    forming at least one substrate via through said second dielectric material and through said integrated circuit substrate down to a first conductor layer within said integrated circuit substrate.

12. The method as set forth in claim 11 further comprising the step of:
    removing said second via resist mask from said layer of second dielectric material and from said first and second vias.

13. The method as set forth in claim 11 further comprising the steps of:
    filling said first via with a second conductor layer to provide an electrical connection to said first end of said thin film resistor through said resistor protect layer that is located under said first portion of said first dielectric layer;
    filling said second via with said second conductor layer to provide an electrical connection to said second end of said thin film resistor though said resistor protect layer that is located under said second portion of said first dielectric layer; and
    filling said substrate via with said second conductor layer to provide an electrical connection to said first conductor layer within said integrated circuit substrate.

14. The method as set forth in claim 2 wherein said step of etching said resistor protect layer provides one of: a reduced etch time, less undercut of said resistor protect layer, a reduced variability of a length of said thin film resistor, and a reduced variability of resistor matching.

15. A method for manufacturing an integrated circuit, said method comprising the steps of:
    forming a thin film resistor on an integrated circuit substrate;
    forming a resistor protect layer over said thin film resistor wherein said resistor protect layer has a value of thickness that is in a range of approximately eight hundred Ångstroms to one thousand Ångstroms;
    forming a first portion of a first dielectric material over said resistor protect layer over a first end of said thin film resistor and a second portion of said first dielectric material over said resistor protect layer over a second end of said thin film resistor;
    etching said resistor protect layer using said first and second portions of said first dielectric layer as a hard mask;
    forming a layer of second dielectric material over said thin film resistor, and over said first and second portions of said first dielectric material;
    forming a first via resist mask on said layer of second dielectric material; and etching a first via down to said resistor protect layer over said first end of said thin film resistor and a second via down to said resistor protect layer over said second end of said thin film resistor.

16. The method as set forth in claim 15 further comprising the steps of:

removing said first via resist mask from said layer of second dielectric material;

forming a second via resist mask over said layer of second dielectric material and over said first and second vias; and forming at least one substrate via through said second dielectric material and through said integrated circuit substrate down to a first conductor layer within said integrated circuit substrate.

17. The method as set forth in claim 16 further comprising the step of:

removing said second resist mask from said layer of second dielectric material and said first and second vias.

18. The method as set forth in claim 17 further comprising the steps of:

filling said first via with a second conductor layer to provide an electrical connection to said first end of said thin film resistor through said resistor protect layer that is located under said first portion of said first dielectric layer;

filling said second via with said second conductor layer to provide an electrical connection to said second end of said thin film resistor though said resistor protect layer that is located under said second portion of said first dielectric layer; and filling said substrate via with said second conductor layer to provide an electrical connection to said first conductor layer within said integrated circuit substrate.

19. The method as set forth in claim 15 wherein said resistor protect layer completely overlaps said thin film resistor and protects said thin film resistor during said step of forming said first and second portions of said first dielectric material.

20. The method as set forth in claim 1 wherein said resistor protect layer completely overlaps said thin film resistor and protects said thin film resistor during said step of forming said first and second portions of said first dielectric material.

* * * * *

UNITED STATES PATENT AND TRADEMARK OFFICE
CERTIFICATE OF CORRECTION

PATENT NO. : 7,410,879 B1 Page 1 of 1
APPLICATION NO. : 11/196787
DATED : August 12, 2008
INVENTOR(S) : Rodney Hill et al.

It is certified that error appears in the above-identified patent and that said Letters Patent is hereby corrected as shown below:

Column 11, line 54, delete "trough" and replace with --through--.

Signed and Sealed this

First Day of September, 2009

David J. Kappos
*Director of the United States Patent and Trademark Office*